(12) United States Patent
Zhu et al.

(10) Patent No.: US 11,750,012 B2
(45) Date of Patent: Sep. 5, 2023

(54) ELECTRONIC DEVICE AND METHOD FOR CHARGING A BATTERY

(71) Applicant: Ningde Amperex Technology Limited, Ningde (CN)

(72) Inventors: Shan Zhu, Ningde (CN); Ting Guan, Ningde (CN); Fei Wu, Ningde (CN)

(73) Assignee: Ningde Amperex Technology Limited, Ningde (CN)

( * ) Notice: Subject to any disclaimer, the term of this patent is extended or adjusted under 35 U.S.C. 154(b) by 353 days.

(21) Appl. No.: 17/007,417

(22) Filed: Aug. 31, 2020

(65) Prior Publication Data

US 2021/0099003 A1 Apr. 1, 2021

Related U.S. Application Data

(63) Continuation-in-part of application No. PCT/CN2019/115554, filed on Nov. 5, 2019.

(30) Foreign Application Priority Data

Sep. 29, 2019 (CN) .......................... 201910934533.X

(51) Int. Cl.
*H02J 7/00* (2006.01)
*G01R 31/392* (2019.01)
(Continued)

(52) U.S. Cl.
CPC ........ *H02J 7/00714* (2020.01); *G01R 31/392* (2019.01); *H01M 10/0525* (2013.01);
(Continued)

(58) Field of Classification Search
CPC .... H01M 10/44; H01M 10/48; H01M 10/443; H01M 10/0525; H02J 7/00; H02J 7/0048;
(Continued)

(56) References Cited

U.S. PATENT DOCUMENTS 4,207,391 A * 6/1980 Church ................. H01M 4/244
205/64
4,307,164 A * 12/1981 Church ................. H01M 4/244
429/207
(Continued)

FOREIGN PATENT DOCUMENTS

CN 105322245 2/2016
CN 105870525 A 8/2016
(Continued)

*Primary Examiner* — John T Trischler
(74) *Attorney, Agent, or Firm* — Ladas & Parry LLP

(57) ABSTRACT

A charging method for charging a battery, including the following steps: obtaining a lithium deposition potential of the anode; obtaining a first charging current $I_n$ at different states of charge (SOC) during an $n^{th}$ charge and discharge cycle based on the lithium deposition potential of the anode, the n is an integer greater than or equal to 0; and during an $m^{th}$ charge and discharge cycle, charging the battery with a second charging current $I_m$, m is an integer greater than n, and $I_m = k_1 \times I_n$, $0.5 \leq k_1 \leq 1$. The present application also provides an electronic device and a storage medium. The above-mentioned charging method, electronic device and storage medium can quickly charge the battery.

14 Claims, 7 Drawing Sheets

(51) Int. Cl.
*H01M 10/44* (2006.01)
*H01M 10/0525* (2010.01)
*H01M 10/42* (2006.01)

(52) U.S. Cl.
CPC ........... *H01M 10/443* (2013.01); *H02J 7/005* (2020.01); *H02J 7/0048* (2020.01); *H02J 7/0069* (2020.01); *H02J 7/007192* (2020.01); *H01M 2010/4292* (2013.01); *H02J 7/0071* (2020.01); *H02J 7/007194* (2020.01)

(58) Field of Classification Search
CPC ...... H02J 7/00714; H02J 7/005; H02J 7/0069; H02J 7/007192; G01R 31/392
USPC ........................................................ 320/137
See application file for complete search history.

(56) References Cited

U.S. PATENT DOCUMENTS

| | | | | |
|---|---|---|---|---|
| 4,372,823 A * | 2/1983 | Church | ................ | H01M 4/244 205/333 |
| 8,816,648 B2 | 8/2014 | Bhardwaj | ............ | H02J 7/0071 320/152 |
| 9,219,377 B2 * | 12/2015 | Nagakura | ......... | H02J 7/007182 |
| 9,435,866 B2 * | 9/2016 | Takahashi | ............ | G01R 31/392 |
| 9,525,300 B2 * | 12/2016 | Aridome | ................ | B60L 58/22 |
| 9,638,729 B2 * | 5/2017 | Maekawa | ........... | H01M 50/569 |
| 10,062,928 B2 * | 8/2018 | Castaneda | ............ | H01M 10/44 |
| 10,135,279 B2 * | 11/2018 | Luo | .......................... | H02J 7/00 |
| 10,193,198 B2 * | 1/2019 | Ishibashi | ............ | G01R 31/3828 |
| 10,461,321 B2 * | 10/2019 | He | .................... | H01M 10/0565 |
| 10,862,323 B2 * | 12/2020 | Banos | .................... | A61H 11/00 |
| 10,910,628 B2 * | 2/2021 | Wood, III | ........... | H01M 4/0445 |
| 10,955,484 B2 * | 3/2021 | Wu | ....................... | G01R 31/389 |
| 11,001,155 B2 * | 5/2021 | Campbell | ................. | B60L 3/12 |
| 11,031,639 B2 * | 6/2021 | Wang | ................... | G01R 31/392 |
| 11,038,164 B2 * | 6/2021 | He | ........................ | H01M 4/382 |
| 11,139,509 B2 * | 10/2021 | Konopka | ............. | H02J 7/00711 |
| 11,404,896 B2 * | 8/2022 | Du | .................... | H02J 7/007188 |
| 2011/0037438 A1 * | 2/2011 | Bhardwaj | ............. | H02J 7/0071 320/152 |
| 2012/0179398 A1 * | 7/2012 | Ueki | ................. | H01M 10/0525 702/63 |
| 2013/0030739 A1 * | 1/2013 | Takahashi | ............ | G01R 31/396 702/63 |
| 2013/0069584 A1 * | 3/2013 | Nagakura | ........... | H01M 10/443 320/162 |
| 2014/0136132 A1 * | 5/2014 | Maekawa | ........... | H01M 10/054 702/63 |
| 2015/0236525 A1 * | 8/2015 | Aridome | ................. | H02J 7/005 320/107 |
| 2016/0240840 A1 * | 8/2016 | He | ..................... | H01M 10/0565 |
| 2017/0098858 A1 * | 4/2017 | Kim | ................. | H01M 10/0568 |
| 2017/0179546 A1 * | 6/2017 | Castaneda | ............. | H01M 10/44 |
| 2017/0279171 A1 * | 9/2017 | Ishibashi | ............. | H01M 10/486 |
| 2017/0366015 A1 * | 12/2017 | Luo | ........................... | H02J 7/00 |
| 2019/0140325 A1 * | 5/2019 | Wang | ..................... | G01R 31/50 |
| 2019/0178950 A1 * | 6/2019 | Wu | ....................... | G01R 31/389 |
| 2019/0198856 A1 * | 6/2019 | Wood, III | ............. | H01M 10/44 |
| 2019/0221895 A1 * | 7/2019 | Konopka | ................... | H02J 7/04 |
| 2019/0245369 A1 | 8/2019 | Banos et al. | | |
| 2020/0052290 A1 * | 2/2020 | He | .......................... | H01M 4/13 |
| 2020/0223318 A1 * | 7/2020 | Campbell | ............... | B60L 58/15 |
| 2020/0287399 A9 * | 9/2020 | Banos | .................... | A61H 11/00 |
| 2021/0066947 A1 * | 3/2021 | Du | .................... | H02J 7/007182 |
| 2021/0119461 A1 * | 4/2021 | Guan | ................... | H02J 7/00302 |
| 2021/0119466 A1 * | 4/2021 | Guan | ................. | H02J 7/007192 |
| 2021/0143391 A1 * | 5/2021 | Wood, III | ............. | H02J 7/0068 |
| 2021/0351446 A1 * | 11/2021 | Zhu | ....................... | H02J 7/0068 |
| 2021/0391742 A1 * | 12/2021 | Guan | ................. | H01M 10/44 |
| 2022/0029208 A1 * | 1/2022 | Konopka | ............... | H02J 7/02 |
| 2022/0029209 A1 * | 1/2022 | Konopka | ............. | H01M 10/44 |

FOREIGN PATENT DOCUMENTS

| | | |
|---|---|---|
| CN | 106099230 | 11/2016 |
| CN | 107706471 | 2/2018 |
| CN | 109546248 | 3/2019 |
| CN | 110165321 | 8/2019 |

* cited by examiner

ELECTRONIC DEVICE AND METHOD FOR CHARGING A BATTERY

CROSS-REFERENCE TO RELATED APPLICATIONS

This application is a continuation-in-part of International Patent Application No. PCT/CN2019/115554, filed on Nov. 5, 2019, which claims priority to Chinese Patent Application No. 201910934533.X filed on Sep. 29, 2019, the contents of the aforementioned patent applications are incorporated by reference herein.

TECHNICAL FIELD

The subject matter herein generally relates to batteries, especially relates to a method for charging a battery, an electronic device and a storage medium.

BACKGROUND

A current commonly used charging method is charging with constant current and charging with constant voltage. That is, a charging process of the method includes charging a battery with the constant current until a voltage of the battery is equal to a preset cut-off voltage (which can be understood as a charging limit voltage), then stopping the charging with the constant current, and then charging the battery with the cut-off voltage until the battery is fully charged. Because the battery has a polarization phenomenon during the charging process, the larger the current, the more severe is the polarization phenomenon. When the battery is charged to the cut-off voltage with the constant current, the battery does not reach a fully charged state due to the presence of polarization phenomenon. Therefore, there is a need to continue to charge the battery with the constant voltage. During the constant voltage charging process, the voltage remains constant and the charging current gradually decreases. When it is monitored that the charging current decreases to the cut-off current, the battery reaches a fully charged state. When using the current commonly used charging method to charge the battery, there are problems that the time of charging the battery with the constant voltage is too long and the charging capacity is small. At the same time, during the long-term high-voltage charging process of the battery, it is easy to cause side effects, causing damage to the battery structure or electrolyte consumption, thereby affecting cycle life of the battery.

In addition, an existing fast charging method includes straight charging method and step charging method. The above two charging methods can achieve a better fast charging process, shorten the constant voltage charging time, and have a certain improvement on the battery cycle life. However, the above two charging methods do not explore the limits of fast charging in principle, and do not adjust the charging current according to the state of the battery during the cycle, which is not the most efficient charging process.

Therefore, it is necessary to propose a fast and efficient battery charging solution to solve these existing problems.

SUMMARY

A method for charging a battery, an electronic device, and a non-transitory storage medium are disclosed.

An embodiment of the present application provides a battery charging method, the method includes steps of: obtaining a lithium deposition potential of an anode of the battery; obtaining a first charging current $I_n$ at different states of charge (SOC) during an $n^{th}$ charge and discharge cycle based on the lithium deposition potential of the anode, and n is an integer greater than or equal to 0; during an $m^{th}$ charge and discharge cycle, charging the battery with a second charging current $I_m$, m is an integer which greater than n, and $I_m = k_1 \times I_n$, $0.5 \leq k_1 \leq 1$.

According to some embodiments of the application, the step of obtaining the lithium deposition potential of the anode of the battery includes: obtaining lithium deposition charging rates of the battery at different temperatures; and determining the lithium deposition potential of the anode of the battery at the different temperatures based on the lithium deposition charging rates.

According to some embodiments of the application, the step of obtaining the lithium deposition charging rates of the battery at different temperatures includes: a first charging step, after the battery is discharged to a fully discharged state, charging the battery with a first predetermined current until the battery is fully charged at a predetermined temperature; a first discharging step, discharging the battery with a second predetermined current until the battery is discharged to the fully discharged state; a cycling step, cyclically performing the first charging step and the first discharging step for a preset number of times, and determining whether the lithium deposition phenomenon occurs in the battery; a first determining step, determining the lithium deposition charging rate of the battery at the predetermined temperature if the lithium deposition phenomenon occurs in the battery; and a first repeating step, changing the predetermined temperature, and repeatedly performing from the first charging step, the first discharging step, the cycling step, the first determining step and the first repeating step, and obtaining the lithium deposition charging rates of the battery at the different temperatures.

According to some embodiments of the application, the step of determining the lithium deposition potential of the anode of the battery at the different temperatures based on the lithium deposition charging rates includes: a second charging step, under the predetermined temperature, charging the battery with a lithium deposition charging rate corresponding to the predetermined temperature; a monitoring step, detecting potentials of the anode of the battery when the battery is charging; a second determining step, determining the lithium deposition potential of the anode of the battery based on changes of the potentials of the anode; and a second repeating step, changing the predetermined temperature, and repeatedly performing from the second charging step, the monitoring step, the second determining step and the second repeating step, and obtaining lithium deposition potential of the anode of the battery at the different temperatures.

According to some embodiments of the application, the step of obtaining the first charging current $I_n$ at the different states of charge (SOC) during the $n^{th}$ charge and discharge cycle based on the lithium deposition potential of the anode includes: charging the battery with a preset initial current at a predetermined temperature; during the $n^{th}$ charge and discharge cycle, controlling the potential of the anode of the battery equal to the lithium deposition potential of the anode corresponding to the predetermined temperature; under the predetermined temperature, obtaining the first charging current $I_n$ at different states of charge when the battery is charging; and changing the predetermined temperature, and repeating above steps for obtaining the first charging current $I_n$ at the different states of charge (SOC) during the $n^{th}$ charge and discharge cycle, and establishing a corresponding relationship among the predetermined temperature, the state of charge, and the first charging current $I_n$.

According to some embodiments of the application, the step of during the $m^{th}$ charge and discharge cycle, charging the battery with the second charging current $I_m$, includes: obtaining a discharge capacity $Q_{m-1}$ of the battery in the $(m-1)^{th}$ charge and discharge cycle; during the $m^{th}$ charge and discharge cycle, charging the battery to a fully charged state with the second charging current.

According to some embodiments of the application, the step of during the $m^{th}$ charge and discharge cycle, charging the battery to the fully charged state with the second charging current includes: during the $m^{th}$ charge and discharge cycle, dividing the state of charge of the battery into N sections; obtaining the first charging currents $I_n$ corresponding to the state of charge of each section of the N sections based on the established corresponding relationship; obtaining a minimum current of the first charging currents $I_n$ corresponding to the state of charge of each section and setting the minimum current as a third charging current $I_c$; determining the second charging current $I_m$ of each section based on the third charging current, $I_m=k_2\times I_c$, $0.5 \le k_2 \le 1$; and during the $m^{th}$ charge and discharge cycle, charging the battery to the fully charged state with the determined second charging current.

According to some embodiments of the application, the charge capacity of the each section is equal to a value multiplied by the discharge capacity $Q_{m-1}$, and the value is an absolute value of a difference between states of charge corresponding to two endpoints of the each section.

According to some embodiments of the application, a cut-off capacity of the battery when the battery is charged to the fully charged state is equal to the discharge capacity $Q_{m-1}$.

An embodiment of the present application provides an electronic device, the electronic device includes a battery; and a processor is configured to perform an above charging method for charging the battery.

An embodiment of the present application provides a storage medium having stored thereon instructions that, when executed by a processor, causes the processor to perform an above charging method for charging a battery.

Compared with prior art, the foregoing method, electronic device and storage medium, can obtain a first charging current of the battery with different states of charge under the condition that lithium deposition does not occur on an anode of the battery, and determine the second charging current based on the first charging current, and charge the battery with the determined second charging current. The method can greatly shorten the charging time and reduce the occurrence of side effects and reactions between the electrolyte and the cathode of the battery, thereby having less influence on the cathode of the battery. Therefore, the technical solution of the present application not only can charge the battery fast, but also can relatively increase the service life of the battery.

DETAILED DESCRIPTION

For clarity, of illustration of objectives, features and advantages of the present disclosure, the detailed description illustrate the embodiments of the present disclosure hereinafter. Various details are described in the following descriptions for better understanding of the present disclosure. However, the present disclosure may also be implemented in other ways other than those described herein. The scope of the present disclosure is not to be limited by the specific embodiments disclosed below.

The present disclosure, referencing the accompanying drawings, is illustrated by way of examples and not by way of limitation. It should be noted that references to "an" or "one" embodiment in this disclosure are not necessarily to the same embodiment, and such references mean "at least one."

Figure 1:
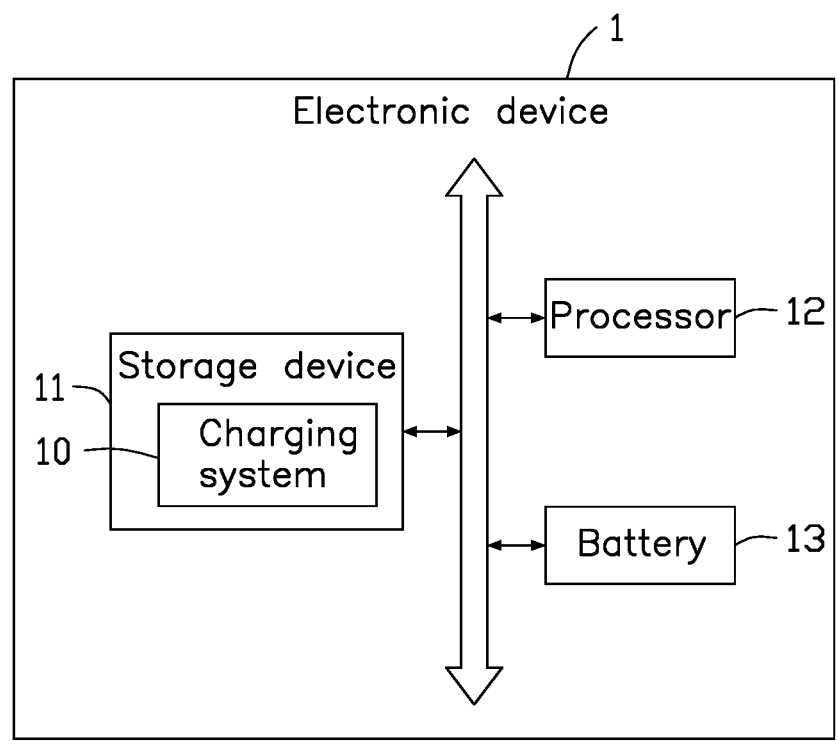
FIG. 1 is a block diagram of an embodiment of an electronic device.

Referring to FIG. 1, a charging system 10 is applied to an electronic device 1. The electronic device 1 may include, but is not limited to, a storage device 11, at least one processor 12, and a battery 13. The storage device 11, the at least one processor 12, and the battery 13 may be connected with each other through a bus, or may be directly electronically connected.

In other embodiment, the electronic device 1 may include, but is not limited to, at least one processor 12, and a battery 13. The at least one processor 12, and the battery 13 may be connected with each other through a bus, or may be directly connected.

It should be noted that FIG. 1 illustrates only one example of the charging system 10, other examples may include more or fewer components that those shown in the embodiment, or have a different configuration of the various components. The electronic device 1 may be, but is not limited to, an electric motorcycle, an electric bicycle, an electric car, a mobile phone, a tablet computer, a personal digital assistant (PDA), a personal computer, or any other suitable rechargeable device.

In at least one embodiment, the battery 13 is a rechargeable battery for supplying power to the electronic device 1. For example, the battery 13 may be a lithium ion battery, a lithium polymer battery, a lithium iron phosphate battery, or the like. The battery 13 may include at least one battery cell, which may be recharged in a recyclable manner. The battery 13 is logically connected to the processor 12 through a battery management system (BMS), so as to realize functions such as charging, discharging, and power management through the power management system.

Although not shown, the electronic device 1 may further include other components such as a WI-FI unit, a BLUETOOTH unit, a speaker, and the like, which are not described in detail here.

Figure 2:
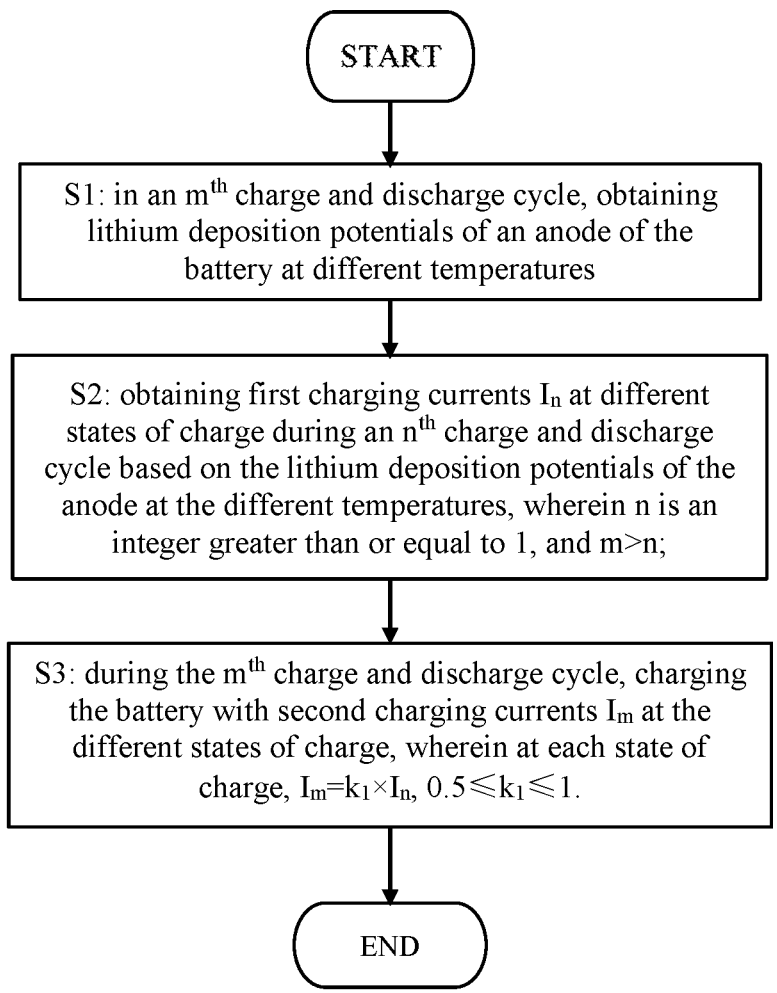
FIG. 2 is a flowchart of an embodiment of a method for charging a battery.

Referring to FIG. 2, FIG. 2 illustrates a flowchart of a method for charging a battery. According to different requirements, an order of steps in the flowchart may be changed, and some steps may be omitted. The method for charging the battery may include the following steps.

In block S1, obtaining a lithium deposition potential of an anode of the battery 13.

In at least one embodiment, steps for obtaining a lithium deposition potential of an anode of the battery 13 may include: obtaining lithium deposition charging rates of the battery 13 at different temperatures, and determining the lithium deposition potential of the anode of the battery 13 at the different temperatures based on the lithium deposition charging rates.

In at least one embodiment, the lithium deposition charging rate is a current charging rate if the battery 13 occurs lithium deposition phenomenon during charging process.

In detail, a method for obtaining the lithium deposition charging rates of the battery 13 at the different temperatures may include:

(a1) after the battery is fully discharged, charging the battery with a first predetermined current until the battery is fully charged at a predetermined temperature. The first predetermined current may be 1 C, 1.1 C or 1.2 C. It should be noted that C is a charging and discharging rate. The charging and discharging rate refers to a current value required to charge the battery to a rated capacity within a period of time, or a current value required to discharge the rated capacity of the battery within the period of time. A value of the charging and discharging rate is equal to the rated capacity divided by the current value. For example, if the rated capacity of the battery is 10 Ah, and the battery is discharging with 2 A current value, then the discharging rate is 0.2 C. If the rated capacity of the battery is 10 Ah, and the battery is discharging with 20 A current value, then the discharging rate is 2 C. In one embodiment, the fully discharged state may be that the capacity of the battery is zero. In other embodiments, the fully discharged state may be that the capacity of the battery is discharged to a predetermined value.

(b1) discharging the battery with a second predetermined current until the battery is discharged to the fully discharged state. The second predetermined current may be 0.2 C, or others.

(c1) after repeating steps (a1) and (b1) a preset number of times, determining whether the lithium deposition phenomenon occurs in the battery. After charging and discharging the battery 5-10 times, charging the battery to the fully charged state. Disassembling the battery, detecting whether lithium deposition occurs in the battery. If so, it is determined that the battery occurs the lithium deposition. Otherwise, it is determined that the battery does not occur the lithium deposition phenomenon. It should be noted that the method for determining whether the lithium deposition occurs is not limited to the above-mentioned method, and may also be any other achievable method. For example, a method for determining whether the lithium deposition occurs may be by monitoring the voltage of anode.

(d1) determining the lithium deposition charging rate of the battery 13 at the predetermined temperature if the lithium deposition occurs in the battery, and changing the predetermined temperature and repeating step (a1), (b1), (c1) and step (d1) for acquiring the lithium deposition charging rates of the battery 13 at the different temperatures.

In at least one embodiment, determining the lithium deposition potential of the anode of the battery 13 at the different temperatures by detecting the potential of the anode through a three-electrode battery when the battery is charging.

step (a2), charging the battery at a predetermined temperature (e.g., 25 Celsius) with a lithium deposition charging rate corresponding to the predetermined temperature.

step (b2), monitoring the potential of the anode of the battery when the battery is charging.

step (c2), determining the lithium deposition potential of the anode of the battery 13 based on changes of the monitored potentials of the anode. Using the following method to determine the lithium deposition potential of the anode: charging the battery at a predetermined temperature (e.g., 25 Celsius) with a lithium deposition charging rate corresponding to the predetermined temperature, using the three-electrode battery to observe the potential of the anode, taking a minimum potential of the observed potential as the lithium deposition potential of the anode at the predetermined temperature.

step (d2), changing the predetermined temperature and repeatedly performing from step (a2), step (b2), step (c2) and step (d2) for obtaining the lithium deposition potential of the anode of the battery at the different temperatures.

At block S2, obtaining a first charging current $I_n$ at different states of charge (SOC) during an $n^{th}$ charge and discharge cycle based on the lithium deposition potential of the anode, the n is an integer greater than or equal to 0.

In at least one embodiment, a method for obtaining the first charging current $I_n$ may include:

step (a3), charging the battery with a preset initial current (such as 1 C) at the predetermined temperature.

step (b3), during the $n^{th}$ charge and discharge cycle, controlling the potential of the anode of the battery be equal to the lithium deposition potential of the anode corresponding to the predetermined temperature, and charging the battery with a constant voltage.

step (c3), detecting and obtaining the first charging current $I_n$ at the different states of charge (SOC) when the battery is charging at the predetermined temperature.

step (d3), changing the predetermined temperature, and repeating from step (a3) to (d3) for obtaining the first charging current $I_n$ at the different states of charge (SOC) during the $n^{th}$ charge and discharge cycle, and establishing a relationship among the predetermined temperature, the state of charge, and the first charging current $I_n$.

It should be noted that after changing the predetermined temperature, the battery which has charged and discharged for n−1 cycles may be used to repeatedly perform from step (a3) to (d3) for acquiring the first charging current $I_n$ at the different states of charge (SOC) during the $n^{th}$ charge and discharge cycle.

In at least one embodiment, a fresh battery may be used to obtain the first charging current $I_n$, and charging the fresh battery or a used battery with a second charging current. For example, a method for obtaining the first charging current by the fresh battery may include: obtaining the lithium deposition charging rates of the fresh battery at the different temperatures, determining the lithium deposition potential of the anode of the fresh battery based on the lithium deposition charging rates, and obtaining the first charging current $I_n$ of the fresh battery at the different states of charge based on the lithium deposition potential of the anode. The fresh battery is unused from a factory and, or has just charged and discharged for a number of cycles less than a predetermined number (e.g., ten, or others). Additionally, the first charging current $I_n$ of the fresh battery may be obtained by the method from step (a3) to step (d3), and such method also may establish a relationship among the predetermined temperature, the state of charge, and the first charging current $I_n$ of the fresh battery.

At block S3, charging the battery with a second charging current $I_m$ during an $m^{th}$ charge and discharge cycle, m is an integer greater than n, and $I_m=k_1 \times I_n$, $0.5 \leq k_1 \leq 1$.

In other embodiments, $0.8 \leq k_1 \leq 1$, the larger the $k_1$, the shorter the time for charging the battery to the fully charged state.

It should be noted that, having calculated the second charging current based on the first charging current by using the fresh battery, the second charging current may be used as a charging current for each charging process of the fresh battery in the subsequent charge and discharge cycles. The second charging current also may be used as a charging current for each charging process of a recycled battery in the subsequent charge and discharge cycles. For example, the second charging current may be used to charge the fresh battery, and may be used to charge the recycled battery which has charged and discharged for 300 cycles (or other cycles). When the battery is charged by the second charging current, not only may the battery be quickly charged, but it may also play a role in extending the cycling life of the battery.

In at least one embodiment, before charging the battery by the second charging current, obtaining a discharge capacity of the battery in the $(m-1)^{th}$ charge and discharge cycle, and setting the obtained discharge capacity as a charge cut-off capacity of the $m^{th}$ charge and discharge cycle. For example, obtaining a discharge capacity of the battery in the $(m-1)^{th}$ charge and discharge cycle, and charging the battery with the second charging current until the battery is charged to the fully charged state during the $m^{th}$ charge and discharge cycle. The charge cut-off capacity of the battery at the fully charged state is equal to the discharge capacity of the battery in the $(m-1)^{th}$ charge and discharge cycle.

In at least one embodiment, when charging the battery, the following methods may be used: obtaining the discharge capacity $Q_{m-1}$ of the battery in the $(m-1)^{th}$ charge and discharge cycle; dividing the state of charge of the battery into N sections when the battery is in the $m^{th}$ charge and discharge cycle; obtaining the first charging currents corresponding to the states of charge of each section based on the established corresponding relationship; obtaining a minimum first charging current from each section and setting the minimum first charging current as a third charging current $I_c$; calculating the second charging current of each section based on the third charging current, $I_m=k_2 \times I_c$, $0.5 \leq k_2 \leq 1$; and charging the battery to the fully charged state with the calculated second charging current in the $m^{th}$ charge and discharge cycle.

In at least one embodiment, $0.8 \leq k_2 \leq 1$, where the larger the $k_2$, the shorter the time for charging the battery to the fully charged state.

It should be noted that the charge capacity of the each section is equal to a value multiplied by a discharge capacity $Q_{m-1}$, and the value is calculated by an absolute value of a difference between states of charge corresponding to two endpoints of the each section. The cut-off capacity when the battery is fully charged is equal to the discharge capacity $Q_{m-1}$.

In another embodiment, when charging a fresh battery, obtaining the discharge capacity $Q_{m-1}$ of the fresh battery, and charging the fresh battery with the second charging current until the fresh battery is charged to the fully charged state during the $m^{th}$ charge and discharge cycle. The charge cut-off capacity of the fresh battery at the fully charged state is the discharge capacity of the fresh battery in the $(m-1)^{th}$ charge and discharge cycle. In detail, obtaining the discharge capacity $Q_0$ of the fresh battery; dividing the state of charge of the fresh battery into N sections ($10<N<\infty$) when the fresh battery is charging; obtaining the first charging currents corresponding to the states of charge of each section based on the established relationship; obtaining a minimum first charging current from each section and setting the minimum first charging current as a third charging current $I_c$; calculating the second charging current of each section based on the third charging current, $I_m=k_2 \times I_c$, $0.5 \leq k_2 \leq 1$; and charging the fresh battery to the fully charged state with the calculated second charging current.

It should be noted that the charge cut-off capacity of the fresh battery if the fresh battery is charged to the fully charged state is the discharge capacity $Q_0$. Additionally, by using a preset current (such as 0.1 C) to discharge the fresh battery, the discharge capacity $Q_0$ may be obtained by recording the capacity during the above discharge process.

Through the above steps S1 to S3, the second charging current may be obtained under the condition that lithium deposition phenomenon does not occur on the anode, and the charging time of the battery in the constant current phase under the second charging current may be greatly reduced. Although the relative potential of a cathode will rise during the charging process, the time of the cathode staying at higher potential is relatively shorter, which could reduce the side reactions between electrolyte and the cathode of the battery. The charging method can protect the cathode relatively. Therefore, using the charging method could not only shorter the charging time, but also prolong the cycle life of the battery. In order to further illustrate, a method for charging a battery is described in detail below with reference to the embodiments.

Comparative Embodiment 1

The conventional charging method (such as a constant current and constant voltage charging method) is used to charge the fresh battery (the fresh battery has been charged and discharged 1 cycle) is charged. The environment temperature of the battery is 45 Celsius as an example.

Step 1) performing constant current charging with a current of 0.7 C until a voltage of the fresh battery is 4.45V;

Step 2) performing constant voltage charging with a voltage of 4.45V until a cut-off current of the fresh battery is 0.05 C;

Step 3) letting the fresh battery stand for 5 minutes;

Step 4) performing constant current discharging with a current of 0.5 C until a voltage of the fresh battery is 3V;

Step 5) standing the fresh battery for 5 minutes;

Step 6) repeating the step 1) to step 5) 500 times, that is charging and discharging the fresh battery for 500 cycles.

Embodiment 1

Using the battery charging method provided in the present application to charge the battery. It should be noted that the embodiments 1-3 use the fresh battery to acquire the first charging current, and discharging the fresh battery with the first charging current. The environment temperature of embodiment 1 is the same as that of the comparative embodiment 1.

(1) establishing a correspondence between the state of charge and the first charging current.

Step 1) monitoring the anode potential of the fresh battery (e.g. capacity of the fresh battery is 2000 mAh) by three electrodes and a potential monitor. The fresh battery may be made of $LiCoO_2$ as the cathode, graphite as the anode, a separator, an electrolyte, a packaging case, and the like. Alternatively, other materials for the cathode and anode may be used to make the battery.

Step 2) determining the lithium deposition potential of the anode of the fresh battery;

Step 3) during the charging process, controlling the lithium deposition potential of the anode of the fresh battery equal to the determined potential. Then acquiring the first charging current of different states of charge in the charging process, and establishing the correspondence between the state of charge and the first charging current.

(2) the charging process:

Step 1) dividing the state of charge of the charging process of the battery to be charged into 25 sections, and obtaining the first charging currents corresponding to the states of charge of each section based on the established correspondence; obtaining a minimum current from the obtained first charging currents and setting the minimum current as a third charging current $I_c$, $I_m = k_2 \times I_c$, and $k_2 = 1$, then the minimum current is the second charging current of the section. For example, if the states of the charge of a section is 40%-45%, the obtained charging current is 1.7 A (0.85 C). If the states of the charge of another section is 45%-47%, the obtained charging current is 1.8 A (0.9 C).

Step 2) obtaining the discharge capacity of the battery in previous charge and discharge cycle.

Step 3) performing the constant current charging with the second charging current corresponds to each section of step 1), and the capacity of the charging process is equal to the discharge capacity Q.

Step 4) standing the battery for 5 minutes;

Step 5) performing constant current discharging with a current of 0.5 C until a voltage of the battery is equal to the discharge cut-off voltage (e.g., 3V), and obtaining the discharge capacity Q during the discharge process, and setting the obtained discharge capacity as the charge capacity of next charge and discharge cycle.

Step 6) standing the battery for 5 minutes;

Step 7) repeating the step 3) to step 6) 500 times, that is charging and discharging the battery 500 cycles.

Embodiment 2

The charging process is the same as Embodiment 1 except that in step 2) $k_2 = 0.8$.

Embodiment 3

The charging process is the same as Embodiment 1 except that in step 2) $k_2 = 0.5$.

Although the capacity of the battery in the charge and discharge cycle will be reduced, the established correspondence of the fresh battery may be used to charge the battery. That is, regardless of the shift in state of charge (SOC) caused by capacity decay, the battery charging process may be accelerated.

Comparative Embodiment 2

The charging process is the same as the Comparative Embodiment 1 except that the recycled battery has been charged and discharged for 200 cycles.

Embodiment 4

Using the battery charging method provided in the present application to charge the battery. It should be noted that the embodiments 4-5 use the recycled battery to obtain the first charging current, and discharge the recycled battery with the first charging current. The environment temperature of the embodiment 4 is the same as that of the comparative embodiment 2.

(1) establishing a correspondence between the state of charge and the first charging current.

Step (1) is the same as step (1) of embodiment (1) except that the recycled battery is used to obtain the corresponding parameters (e.g., state of charge, and first charging current).

(2) the charging process:

The charging process of embodiment 4 is the same as the embodiment 1 except that the recycled battery is used for charge or discharge.

It should be noted that the first charging current of the embodiment 4 is calculated by the parameters of the recycled battery. As an impedance of the anode of the battery decreases during charge and discharge cycles, the first charging current of embodiment 4 is greater than the first charging current of embodiment 1.

Embodiment 5

The charging process is the same as Embodiment 1 except that in step 2) $k_2 = 0.5$.

During the charging and discharging process of the above the comparative embodiments 1 and 2, and the embodiments 1-5, obtaining and recording parameters (capacity retention ration and time for full charged) in table 1.

TABLE 1

Test results of the comparative embodiments and embodiments

| | $k_2$ | Capacity retention ration of the battery after the battery charged and discharged for 500 cycles | Time for full charged after the battery charged and discharged for 1 cycle (min) | Time for full charged after the battery charged and discharged for 500 cycle (min) |
|---|---|---|---|---|
| Comparative embodiment 1 | — | 88.1% | 78 | 90 |
| Embodiment 1 | 1 | 89.4% | 40.8 | 37.2 |
| Embodiment 2 | 0.8 | 89.3% | 52 | 48 |
| Embodiment 3 | 0.5 | 88.4% | 79 | 74 |

TABLE 1-continued

Test results of the comparative embodiments and embodiments

| | $k_2$ | Capacity retention ration of the battery after the battery charged and discharged for 500 cycles | Time for full charged after the battery charged and discharged for 1 cycle (min) | Time for full charged after the battery charged and discharged for 500 cycle (min) |
|---|---|---|---|---|
| Comparative embodiment 2 | — | 85.2% | 82 | 98 |
| Embodiment 4 | 1 | 86% | 36 | 33 |
| Embodiment 5 | 0.5 | 85.4% | 71 | 67 |

Figure 3:
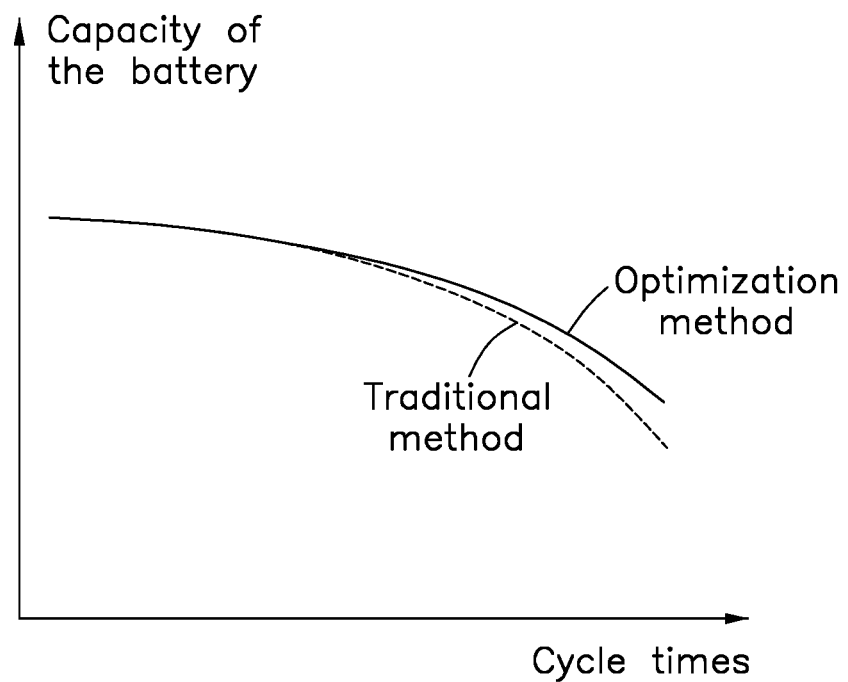
FIG. 3 is a comparative diagram of battery capacity attenuation using traditional method and charging method of the present application.

It can be known from Table 1 that the time required to charge the battery by the charging method provided by the technical solution of the present application is significantly shorter than the time required to charge the battery by the traditional method. The charging method provided by the present application can greatly shorten the charging time of the battery under the condition that the anode does not occur lithium deposition phenomenon, and to achieve the effect of fast charging. The charging method provided by the present application can further reduce capacity decay of the battery and extend cycle life of the battery. As shown in FIG. 3, if the battery is charged and discharged by the traditional method, the capacity of the battery decays more as the number of cycles increases. However, if the battery is charged and discharged by the charging method provided by the present application, there will be less decay in the capacity of the battery as the number of cycles increases.

Figure 4:
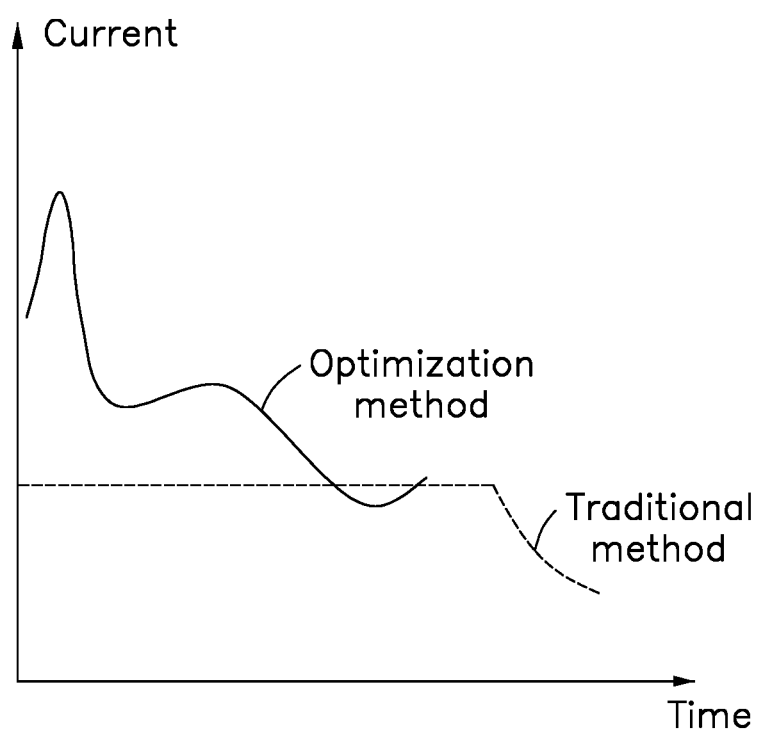
FIG. 4 is a graph showing the change of the charging current over time when the battery is charged using the charging method of the present application and the traditional method.

Referring to FIG. 4, change graph of charging current with time when charging the battery using the charging method (optimization method) provided by the present application and the traditional method (the constant current and constant voltage charging method described in the background). As can be seen from the FIG. 4, performing constant current charging the battery for a certain time, and performing constant voltage charging by the traditional method. The charging current decreases over time during the constant voltage charging process. The charging current of the optimization method is dynamically changing during charging process, the charging current of the optimization method is greater than the charging current of the traditional method, and the charging time of the optimization method is much shorter than that of the traditional method. In other words, the optimization method provided in the present application can greatly shorten the charging time when the battery is charged to a fully charged state, so as to achieve rapid charging of the battery.

Figure 5:
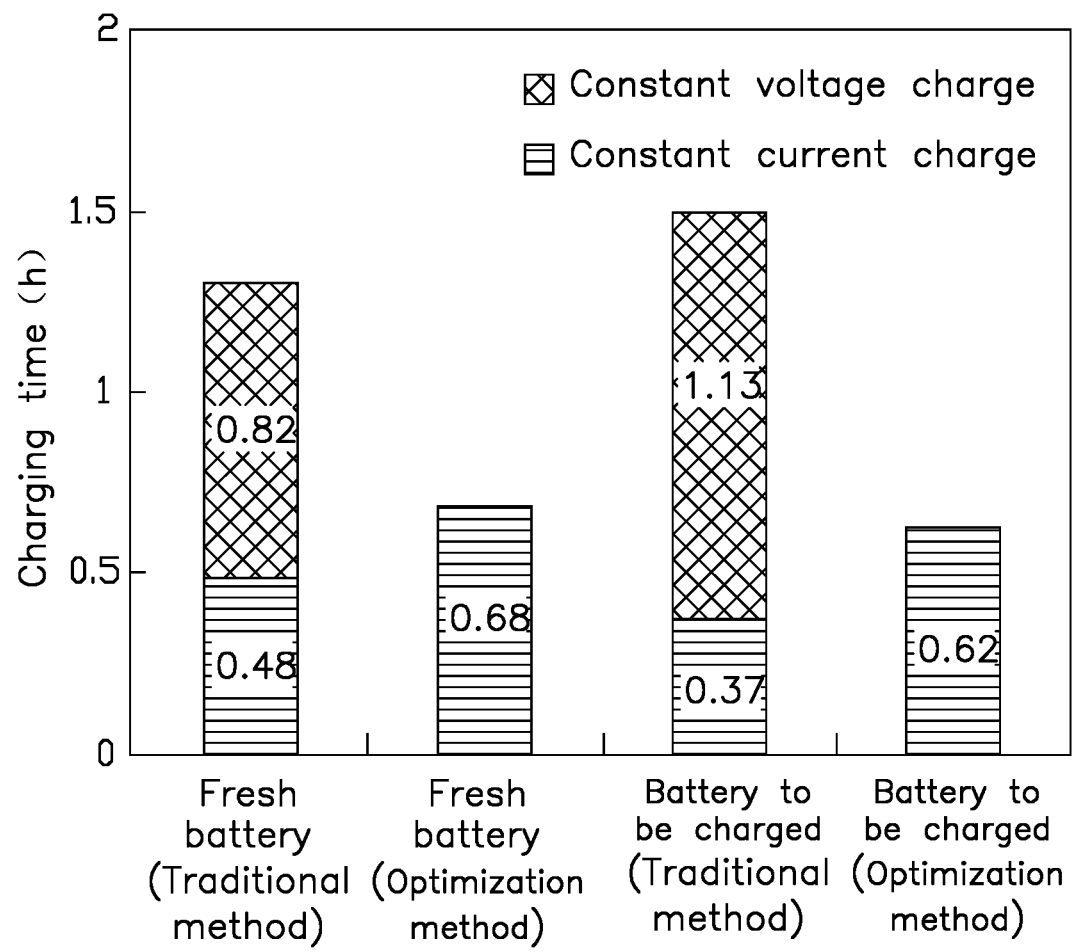
FIG. 5 is a chart comparing the time required for charging for the fresh battery and the battery to be charged by the charging method in Embodiment 1 and the traditional method in the Comparative Example 1.

Referring to FIG. 5, FIG. 5 shows comparison of the time required for charging for the fresh battery and the battery to be charged (that is, the battery) by the charging method (that is, the optimization method) in Embodiment 1 and the traditional method in the Comparative Example 1 (that is, the constant-current and constant-voltage charging method described in the background art). The battery to be charged is a fresh battery which has charged and discharged for 500 cycles. As can be seen from the FIG. 5, the first bar from left to right indicates that when charging the fresh battery using the traditional method, the time required for the constant current charging process is 0.43 hours and the time required for the constant voltage charging process is 0.95 hours. A total of 1.38 hours is required to charge the fresh battery to be fully charged state. The second bar indicates that when charging the fresh battery using the charging method provided by the present application, the time required for charging the fresh battery to be fully charged state is 0.68 hours, which greatly reduces the charging time. For a battery that has been charged and discharged 500 cycles, the third bar indicates that when charging the battery to be charged using the traditional method, the time required for the constant current charging process is 0.37 hours and the time required for the constant voltage charging process is 1.13 hours, a total of 1.5 hours is required to charge the battery to be fully charged state. The fourth bar indicates that when charging the battery to be charged using the charging method provided by the present application, the time required for charging the fresh battery to be fully charged state is 0.62 hours, which also greatly reduces the charging time. The charging time required to charge the battery to be charged using the charging method provided in the present application is shorter than the charging time required to charge the fresh battery.

Figure 6:
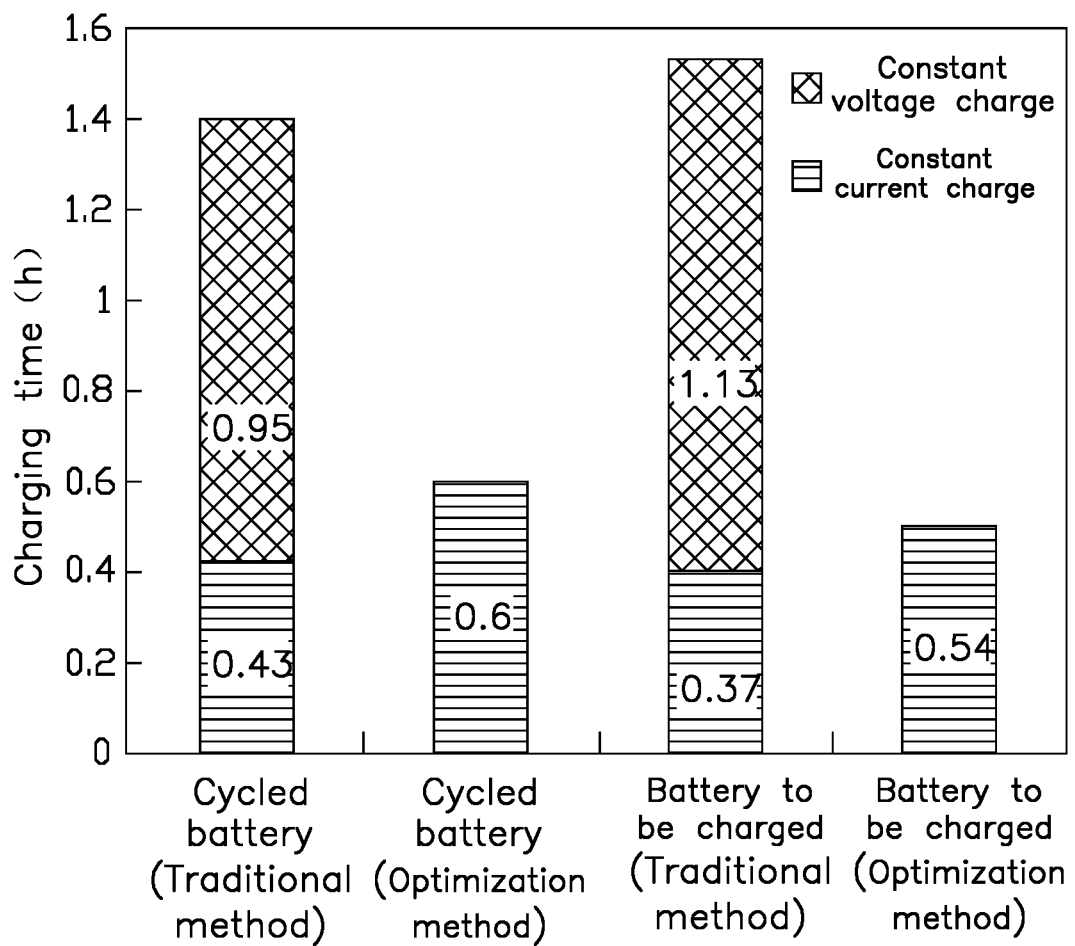
FIG. 6 is a chart comparing the time required for charging the fresh battery and the battery to be charged by the charging method in Embodiment 4 and the traditional method in the Comparative Example 2.

Referring to FIG. 6, FIG. 6 shows comparison of the time required for charging the fresh battery which has been charged and discharged for 200 cycles (for convenience of description, hereinafter referred to as "the cycled battery") and the battery to be charged (that is, the battery) by the charging method (that is, the optimization method) in Embodiment 4 and the traditional method (that is, the constant-current and constant-voltage charging method described in the background art) in the Comparative Example 2. Wherein, the battery to be charged is fresh battery which has charged and discharged for 500 cycles. As can be seen from the FIG. 6, the first bar from left to right indicates that when charging the cycled battery using the traditional method, the time required for the constant current charging process is 0.43 hours and the time required for the constant voltage charging process is 0.95 hours, a total of 1.38 hours is required to charge the cycled battery to be fully charged state. The second bar indicates that when charging the cycled battery using the charging method provided by the present application, the time required for charging the cycled battery to be fully charged state is 0.6 hours, which greatly reduces the charging time. For a battery that has been charged and discharged for 500 cycles, the third bar indicates that when charging the battery to be charged using the traditional method, the time required for the constant current charging process is 0.37 hours and the time required for the constant voltage charging process is 1.13 hours, a total of 1.5 hours is required to charge the battery to be fully charged state. The fourth bar indicates that when charging the battery to be charged using the charging method provided by the present application, the time required for charging the fresh battery to be fully charged state is 0.54 hours, which also greatly reduces the charging time. The charging time required to charge the battery to be charged using the charging method provided in the present application is much shorter than the charging time required to charge the cycled battery.

Additionally, from the four bars of FIG. 5 and four bars of FIG. 6, the time for charging the battery to be charged to a fully charged state by using a first charging current and the determined second charging current is greater than the time for charging the battery to be charged to a fully charged state by using a third charging current and the determined second charging current. The first charging current is calculated by the charging method for charging the fresh battery which is provided in the present application. The third charging current is calculated by the charging method for charging the cycled battery which is provided in the present application. Since the anode impedance of the battery will decrease as the charge and discharge cycle progresses, the second charging current which is determined based on the cycled battery will be greater than the second charging current which is determined based on the fresh battery. Therefore, compared with the speed of charging the battery to be charged using the second charging current determined by the fresh battery, the speed of charging the battery to be charged using the second charging current determined by the cycled battery is faster, and the battery can be charged to a fully charged state more quickly.

Figure 7:
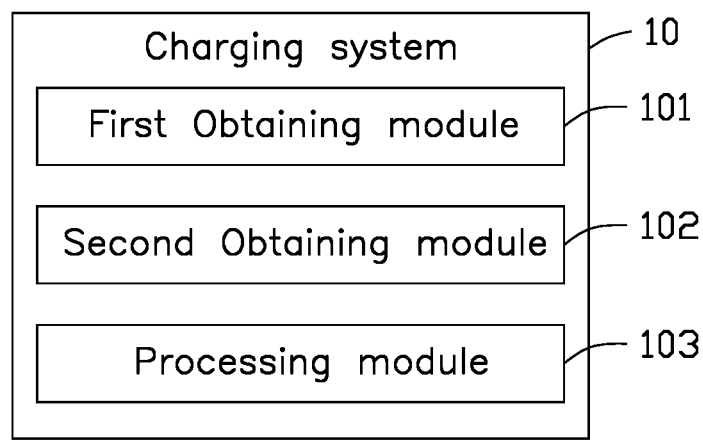
FIG. 7 is a block diagram of one embodiment of a charging system.

Referring to FIG. 7, in at least one embodiment, the charging system 10 may be divided into one or more modules, and the one or more modules are stored in the memory 11 and executed by at least one processor (a processor 12 in this embodiment). The one or more modules may be a series of computer program instruction segments capable of performing specific functions, and the instruction segments are used to describe the execution process of the charging system 10 in the electronic device 1. For example, the charging system 10 may be divided into a first obtaining module 101, a second obtaining module 102, and a processing module 103, as shown in FIG. 7.

In other embodiment, the charging system 10 may be divided into one or more modules, and the one or more modules are stored in the processor 12 and executed by the processor 12 to complete the present application. The one or more modules may be a series of computer program instruction segments capable of performing specific functions, and the instruction segments are used to describe the execution process of the charging system 10 in the electronic device 1. For example, the charging system 10 may be divided into a first obtaining module 101, a second obtaining module 102, and a processing module 103, as shown in FIG. 7.

In at least one embodiment, the first obtaining module 101 may obtain a lithium deposition potential of an anode of the battery. The second obtaining module 102 may obtain a first charging current $I_n$ at different states of charge (SOC) during the $n^{th}$ charge and discharge cycle based on the lithium deposition potential of the anode, the n is an integer greater than or equal to 0. The processing module 103 may charge the battery with a second charging current $I_m$ during the $m^{th}$ charge and discharge cycle, m is an integer greater than n, $I_m = k_1 \times I_n$, $0.5 \leq k_1 \leq 1$.

The charging system 10 provided by the present application not only can charge the battery fast, but also can relatively increase the cycle life of the battery. For details, reference may be made to the embodiments of the foregoing battery charging method, and details are not described herein again.

In at least one embodiment, the storage device 11 may be an internal memory of the electronic device 1, that is, a memory built into the electronic device 1. In other embodiments, the storage device 11 may also be an external memory of the electronic device 1, that is, a memory external to the electronic device 1.

In at least one embodiment, the storage device 11 can be used for storing program code and various data, for example, storing the program code of the charging system 10 installed in the electronic device 1, and achieving high speed, and automatically access programs and data during the operation of the electronic device 1. For example, in this embodiment, the charging system 10 is configured to obtain the first charging current of the fresh battery under different charging states under the condition that the anode of the fresh battery does not occur lithium deposition phenomenon, and determine the second charging current based on the first charging current, and charge the battery to be charged through the determined second charging current.

The storage device may include a random access memory, and may also include a non-volatile memory, such as a hard disk, a memory, a plug-in hard disk, a Smart Media Card (SMC), a Secure Digital (SD) card, Flash card, at least one disk storage device, flash memory device, or other volatile solid-state storage device.

In at least one embodiment, the at least one processor 12 may be a central processing unit (CPU), or may be other general-purpose processor, digital signal processor (DSPs), and application specific integrated circuit (ASIC), Field-Programmable Gate Array (FPGA), or other programmable logic device, discrete gate, or transistor logic device, or discrete hardware component, etc. The processor 12 may be a microprocessor, or the processor 12 may be any conventional processor.

When the modules/units integrated in the charging system 10 are implemented in the form of software functional units and sold or used as independent products, they may be stored in a non-transitory readable storage medium. Based on this understanding, all or part of the processes in the methods of the above embodiments implemented by the present disclosure may also be completed by related hardware instructed by computer-readable instructions. The computer-readable instructions may be stored in a non-transitory readable storage medium. The computer-readable instructions, when executed by the processor, may implement the steps of the foregoing method embodiments. The computer-readable instructions include computer-readable instruction codes, and the computer-readable instruction codes may be in a source code form, an object code form, an executable file, or some intermediate form. The non-transitory readable storage medium may include any entity or device capable of carrying the computer-readable instruction code, a recording medium, a U disk, a mobile hard disk, a magnetic disk, an optical disk, or a computer memory, a read-only memory (ROM).

It can be understood that the division of the modules described above is only a logical function division, and there may be another division manner in actual implementation. In addition, each functional module in each embodiment of the present application may be integrated in the same processing unit, or each module may exist separately physically, or two or more modules may be integrated in the same unit. The above integrated modules may be implemented in the form of hardware, or in the form of hardware plus software functional modules.

A person skilled in the art knows that the present application is not limited to the details of the above exemplary embodiments, and that the present application may be implemented in other specific forms without departing from the spirit or basic features of the application. Therefore, the above-mentioned embodiments of the present application should be regarded as exemplary and non-limiting from any point of view. The scope of the present application is defined by the appended claims rather than the above description. All changes that come within the meaning and scope of equivalents of the claims are encompassed by this application.

What is claimed is:

1. A method for charging a battery in an $m^{th}$ charge and discharge cycle, comprising:
obtaining lithium deposition potentials of an anode of the battery at different temperatures;
obtaining first charging currents $I_n$ at different states of charge during an $n^{th}$ charge and discharge cycle based on the lithium deposition potentials of the anode at the different temperatures, wherein n is an integer greater than or equal to 1, and m>n; and
during the $m^{th}$ charge and discharge cycle, charging the battery with second charging currents $I_m$ at the different states of charge, wherein at each state of charge, $I_m = k_1 \times I_n$, $0.5 \le k_1 \le 1$;
wherein obtaining the first charging currents $I_n$ at the different states of charge during the $n^{th}$ charge and discharge cycle based on the lithium deposition potentials of the anode at the different temperatures comprises:
charging the battery with a preset initial current at a predetermined temperature;
during the $n^{th}$ charge and discharge cycle, controlling the potential of the anode of the battery to be equal to the lithium deposition potential of the anode corresponding to the predetermined temperature;
under the predetermined temperature, obtaining the first charging currents $I_n$ at the different states of charge when the battery is charging; and
changing the predetermined temperature, and repeating above steps for obtaining the first charging currents $I_n$ at the different states of charge during the $n^{th}$ charge and discharge cycle, and establishing a corresponding relationship among the predetermined temperature, the state of charge, and the first charging current $I_n$;
wherein during the $m^{th}$ charge and discharge cycle, charging the battery with the second charging currents $I_m$ at different states of charge comprises:
obtaining a discharge capacity $Q_{m-1}$ of the battery in the (m−1)th charge and discharge cycle; and
during the $m^{th}$ charge and discharge cycle, charging the battery to a fully charged state with the second charging currents $I_m$ at different states of charge;
wherein during the $m^{th}$ charge and discharge cycle, charging the battery to the fully charged state with the second charging currents $I_m$ at the different states of charge comprises:
during the $m^{th}$ charge and discharge cycle, dividing the state of charge of the battery into N sections;
obtaining the first charging currents $I_n$ corresponding to the state of charge of each section of the N sections based on the established corresponding relationship;
obtaining a minimum current of the first charging currents $I_n$ corresponding to the state of charge of each section and setting the minimum current as a third charging current $I_c$;
determining the second charging current $I_m$ of each section based on the third charging current, $I_m = k_2 \times I_c$, $0.5 \le k_2 \le 1$; and
during the $m^{th}$ charge and discharge cycle, charging the battery to the fully charged state with the determined second charging current $I_m$ of each section.

2. The method according to claim 1, wherein a charge capacity of each section of the $m^{th}$ charge and discharge cycle is equal to a value multiplied by the discharge capacity $Q_{m-1}$, and the value is an absolute value of a difference between states of charge corresponding to two endpoints of the each section.

3. The method according to claim 1, wherein a cut-off capacity of the battery when the battery is charged to the fully charged state in the $m^{th}$ charge and discharge cycle is equal to the discharge capacity $Q_{m-1}$ of the battery in the (m−1)th charge and discharge cycle.

4. The method according to claim 1, wherein obtaining the lithium deposition potentials of the anode of the battery at the different temperatures comprises:
obtaining lithium deposition charging rates of the battery at the different temperatures; and
determining the lithium deposition potentials of the anode of the battery at the different temperatures based on the lithium deposition charging rates of the battery at the different temperatures.

5. The method according to claim 4, wherein obtaining the lithium deposition charging rates of the battery at the different temperatures comprises:
obtaining a lithium deposition charging rate of the battery at each of the different temperatures;
wherein the different temperatures are predetermined, and obtaining the lithium deposition charging rate of the battery at a predetermined temperature comprises:
a charging step, after the battery is discharged to a fully discharged state, charging the battery with a first predetermined current until the battery is fully charged;
a discharging step, discharging the battery with a second predetermined current until the battery is discharged to the fully discharged state;
cyclically performing the first charging step and the first discharging step for a preset number of times, and determining whether a lithium deposition phenomenon occurs in the battery; and
determining the lithium deposition charging rate of the battery at the predetermined temperature when the lithium deposition phenomenon occurs in the battery.

6. The method according to claim 4, wherein determining the lithium deposition potentials of the anode of the battery at the different temperatures based on the lithium deposition charging rates of the battery at the different temperatures comprises:
determining a lithium deposition potential of the anode of the battery at each of the different temperatures based on a lithium deposition charging rate of the battery at the temperature;
wherein the different temperatures are predetermined, and determining the lithium deposition potential of the anode of the battery at a predetermined temperature based on the lithium deposition charging rate of the battery at the predetermined temperature comprises:
under the predetermined temperature, charging the battery with the lithium deposition charging rate corresponding to the predetermined temperature;
detecting potentials of the anode of the battery when the battery is charging; and
determining the lithium deposition potential of the anode of the battery at the predetermined temperature based on changes of the potentials of the anode.

7. An electronic device, comprising:
a battery; and
a battery charging apparatus comprising at least one processor;
wherein in charging the battery in an $m^{th}$ charge and discharge cycle, the at least one processor is configured to:
obtain lithium deposition potentials of an anode of the battery at different temperatures;
obtain first charging currents $I_n$ at different states of charge during an $n^{th}$ charge and discharge cycle based on the lithium deposition potentials of the anode at the different temperatures, wherein n is an integer greater than or equal to 1, and m>n; and
during the $m^{th}$ charge and discharge cycle, control the battery charging apparatus to charge the battery with second charging currents $I_m$ at the different states of charge, wherein at each state of charge, $I_m=k_1 \times I_n$, $0.5 \leq k_1 \leq 1$;
wherein in obtaining the first charging currents $I_n$ at the different states of charge during the $n^{th}$ charge and discharge cycle based on the lithium deposition potentials of the anode at the different temperatures, the at least one processor is configured to:
charge the battery with a preset initial current at a predetermined temperature;
during the $n^{th}$ charge and discharge cycle, control the potential of the anode of the battery to be equal to the lithium deposition potential of the anode corresponding to the predetermined temperature;
under the predetermined temperature, obtain the first charging currents $I_n$ at the different states of charge when the battery is charging; and
change the predetermined temperature, and repeat above steps for obtaining the first charging currents $I_n$ at the different states of charge during the $n^{th}$ charge and discharge cycle, and establish a corresponding relationship among the predetermined temperature, the state of charge, and the first charging current $I_n$;
wherein during the $m^{th}$ charge and discharge cycle, in charging the battery with the second charging currents $I_m$ at the different states of charge, the at least one processor is configured to:
obtain a discharge capacity $Q_{m-1}$ of the battery in the (m−1)th charge and discharge cycle; and
during the $m^{th}$ charge and discharge cycle, charge the battery to a fully charged state with the second charging current $I_m$ at the different states of charge;
wherein during the $m^{th}$ charge and discharge cycle, in charging the battery to the fully charged state with the second charging currents $I_m$ at the different states of charge, the at least one processor is configured to:
divide the state of charge of the battery into N sections during the $m^{th}$ charge and discharge cycle;
obtain the first charging currents $I_n$ corresponding to the state of charge of each section of the N sections based on the established corresponding relationship;
obtain a minimum current of the first charging currents $I_n$ corresponding to the state of charge of each section and set the minimum current as a third charging current $I_c$;
determine the second charging current $I_m$ of each section based on the third charging current, $I_m=k_2 \times I_c$, $0.5 \leq k_2 \leq 1$; and
during the $m^{th}$ charge and discharge cycle, charge the battery to the fully charged state with the determined second charging current $I_m$ of each section.

8. The electronic device according to claim 7, wherein a charge capacity of each section of the $m^{th}$ charge and discharge cycle is equal to a value multiplied by the discharge capacity $Q_{m-1}$, and the value is an absolute value of a difference between states of charge corresponding to two endpoints of each section.

9. The electronic device according to claim 7, wherein a cut-off capacity of the battery when the battery is charged to the fully charged state in the $m^{th}$ charge and discharge cycle is equal to the discharge capacity $Q_{m-1}$ of the battery in the (m−1)th charge and discharge cycle.

10. The electronic device according to claim 7, wherein in obtaining the lithium deposition potentials of the anode of the battery at the different temperatures, the at least one processor is configured to:
obtain lithium deposition charging rates of the battery at the different temperatures; and
determine the lithium deposition potentials of the anode of the battery at the different temperatures based on the lithium deposition charging rates of the battery at the different temperatures.

11. The electronic device according to claim 10, wherein in obtaining the lithium deposition charging rates of the battery at the different temperatures, the at least one processor is configured to:
obtain a lithium deposition charging rate of the battery at each of the different temperatures;
wherein the different temperatures are predetermined, and in obtaining the lithium deposition charging rate of the battery at a predetermined temperature, the at least one processor is configured to execute:
a charging step, after the battery is discharged to a fully discharged state, charging the battery with a first predetermined current until the battery is fully charged;
a discharging step, discharging the battery with a second predetermined current until the battery is discharged to the fully discharged state;
cyclically perform the charging step and the discharging step for a preset number of times, and determine whether a lithium deposition phenomenon occurs in the battery; and
determine the lithium deposition charging rate of the battery at the predetermined temperature when the lithium deposition phenomenon occurs in the battery.

12. The electronic device according to claim 10, wherein in determining the lithium deposition potentials of the anode of the battery at the different temperatures based on the lithium deposition charging rates of the battery at the different temperatures, the at least one processor is configured to:
determine a lithium deposition potential of the anode of the battery at each of the different temperatures based on a lithium deposition charging rate of the battery at the temperature;
wherein the different temperatures are predetermined, and in determining the lithium deposition potential of the anode of the battery at a predetermined temperature based on the lithium deposition charging rate of the battery at the predetermined temperature, the at least one processor is configured to:
under the predetermined temperature, charge the battery with the lithium deposition charging rate corresponding to the predetermined temperature;

detect potentials of the anode of the battery when the battery is charging; and determine the lithium deposition potential of the anode of the battery at the predetermined temperatures based on changes of the monitored potentials of the anode.

13. A non-transitory storage medium having stored thereon instructions that, when executed by a battery charging apparatus comprising a processor, causes the processor to perform a process for charging a battery, in an $m^{th}$ charge and discharge cycle, the process comprising:

obtaining lithium deposition potentials of an anode of the battery at different temperatures;

obtaining first charging currents $I_n$ at different states of charge during an $n^{th}$ charge and discharge cycle based on the lithium deposition potentials of the anode at the different temperatures, wherein n is an integer greater than or equal to 1, and m>n; and during the $m^{th}$ charge and discharge cycle, charging the battery with second charging currents $I_m$ at the different states of charge, $I_m = k_1 \times I_n$, $0.5 \leq k_1 \leq 1$;

wherein obtaining the first charging currents $I_n$ at the different states of charge during the $n^{th}$ charge and discharge cycle based on the lithium deposition potentials of the anode at the different temperatures comprises:

charging the battery with a preset initial current at a predetermined temperature;

during the $n^{th}$ charge and discharge cycle, controlling the potential of the anode of the battery to be equal to the lithium deposition potential of the anode corresponding to the predetermined temperature;

under the predetermined temperature, obtaining the first charging currents $I_n$ at the different states of charge when the battery is charging; and changing the predetermined temperature, and repeating above steps for obtaining the first charging currents $I_n$ at the different states of charge during the $n^{th}$ charge and discharge cycle, and establishing a corresponding relationship among the predetermined temperature, the state of charge, and the first charging current $I_n$;

wherein during the $m^{th}$ charge and discharge cycle, charging the battery with the second charging currents $I_m$ at different states of charge comprises:

obtaining a discharge capacity $Q_{m-1}$ of the battery in the (m−1)th charge and discharge cycle; and during the $m^{th}$ charge and discharge cycle, charging the battery to a fully charged state with the second charging currents $I_m$ at different states of charge;

wherein during the $m^{th}$ charge and discharge cycle, charging the battery to the fully charged state with the second charging currents $I_m$ at the different states of charge comprises:

during the $m^{th}$ charge and discharge cycle, dividing the state of charge of the battery into N sections;

obtaining the first charging currents $I_n$ corresponding to the state of charge of each section of the N sections based on the established corresponding relationship;

obtaining a minimum current of the first charging currents $I_n$ corresponding to the state of charge of each section and setting the minimum current as a third charging current $I_c$;

determining the second charging current $I_m$ of each section based on the third charging current, $I_m = k_2 \times I_c$, $0.5 \leq k_2 \leq 1$; and during the $m^{th}$ charge and discharge cycle, charging the battery to the fully charged state with the determined second charging current $I_m$ of each section.

14. The storage medium according to claim 13, wherein obtaining the lithium deposition potentials of the anode of the battery at the different temperatures comprising:

obtaining lithium deposition charging rates of the battery at the different temperatures; and determining the lithium deposition potentials of the anode of the battery at the different temperatures based on the lithium deposition charging rates of the battery at the different temperatures.

* * * * *